(12) United States Patent
Fontana et al.

(10) Patent No.: US 11,626,355 B2
(45) Date of Patent: Apr. 11, 2023

(54) SEMICONDUCTOR DEVICE AND CORRESPONDING METHOD

(71) Applicant: STMICROELECTRONICS S.R.L., Agrate Brianza (IT)

(72) Inventors: Fulvio Vittorio Fontana, Monza (IT); Giovanni Graziosi, Vimercate (IT); Michele Derai, Milan (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 35 days.

(21) Appl. No.: 17/470,269

(22) Filed: Sep. 9, 2021

(65) Prior Publication Data

US 2021/0407894 A1 Dec. 30, 2021

Related U.S. Application Data

(62) Division of application No. 16/406,911, filed on May 8, 2019, now Pat. No. 11,152,289.

(30) Foreign Application Priority Data

May 14, 2018 (IT) .......................... 102018000005354

(51) Int. Cl.
  *H01L 23/495* (2006.01)
  *H01L 23/00* (2006.01)
  *H01L 21/48* (2006.01)

(52) U.S. Cl.
  CPC .... *H01L 23/49589* (2013.01); *H01L 21/4803* (2013.01); *H01L 21/4828* (2013.01); *H01L 21/4842* (2013.01); *H01L 23/49513* (2013.01); *H01L 23/49548* (2013.01); *H01L 24/48* (2013.01); *H01L 24/73* (2013.01);
  (Continued)

(58) Field of Classification Search
  CPC ................................................ H01L 23/49589
  See application file for complete search history.

(56) References Cited

U.S. PATENT DOCUMENTS

| 5,825,628 A | 10/1998 | Garbelli et al. |
| 6,091,144 A | 7/2000 | Harada |
| 7,166,905 B1 | 1/2007 | Shah |

(Continued)

FOREIGN PATENT DOCUMENTS

JP  S6167231 A  4/1986

*Primary Examiner* — Robert K Carpenter
(74) *Attorney, Agent, or Firm* — Seed Intellectual Property Law Group LLP

(57) ABSTRACT

Methods of forming a semiconductor device comprising a lead-frame having a die pad having at least one electrically conductive die pad area and an insulating layer applied onto the electrically conductive die pad area. An electrically conductive layer is applied onto the insulating layer with one or more semiconductor dice coupled, for instance adhesively, to the electrically conductive layer. The electrically conductive die pad area, the electrically conductive layer and the insulating layer sandwiched therebetween form at least one capacitor integrated in the device. The electrically conductive die pad area comprises a sculptured structure with valleys and peaks therein; the electrically conductive layer comprises electrically conductive filling material extending into the valleys in the sculptured structure of the electrically conductive die pad area.

20 Claims, 13 Drawing Sheets

(52) U.S. Cl.
CPC .................. *H01L 23/49586* (2013.01); *H01L 2224/48247* (2013.01); *H01L 2224/73265* (2013.01)

(56) References Cited

U.S. PATENT DOCUMENTS

| | | |
|---|---|---|
| 8,367,479 B2 | 2/2013 | Nakamura et al. |
| 9,679,832 B1 | 6/2017 | Heng |
| 10,903,150 B2 | 1/2021 | Hishiki et al. |
| 11,152,289 B2 * | 10/2021 | Fontana .............. H01L 21/4803 |
| 2006/0097366 A1 | 5/2006 | Sirinorakul et al. |
| 2009/0039486 A1 | 2/2009 | Shimazaki et al. |
| 2016/0035655 A1 | 2/2016 | Howard et al. |
| 2017/0250128 A1 | 8/2017 | Fontana et al. |

* cited by examiner

SEMICONDUCTOR DEVICE AND CORRESPONDING METHOD

BACKGROUND

Technical Field

The description relates to semiconductor devices and methods of forming same. One or more embodiments may apply to integrating at least one capacitor in at least one semiconductor device, for instance in the die pad (copper) bulk of a lead-frame packaged integrated circuit.

Description of the Related Art

Chip-scale packaging technology may have tight space constrains, thus, discrete capacitors components may have a high cost in terms of area occupancy.

An extensive activity has been devoted to providing integration of discrete capacitors within a (chip-scale) package, leading to placing components around or on top of a semiconductor die. This may result in an increase of average package size and other drawbacks in terms of footprint.

BRIEF SUMMARY

One or more embodiments are directed to semiconductor device having a lead-frame packaging, comprising a sculptured structure formed in a die pad, a layer of electrically conductive filling material and an insulating layer sandwiched therebetween may be exemplary of such a device.

One or more embodiments may relate to a corresponding method.

One or more embodiments may be applied to a variety of technologies such as Flip Chip, QFN (Quad-Flat No-leads), QFN-mr (multi row), TQFP (Thin Quad Flat Pack).

One or more embodiments may comprise a die pad having a sculptured structure in at least one electrically conductive die pad area.

One or more embodiments make it possible to use lead-frame etching techniques and/or laser etching.

One or more embodiments may comprise an insulating layer, for instance provided by jet printing, spray or aerosol dispense of, for instance, curable dielectric material.

One or more embodiments may comprise UV or heat curing the insulating layer.

One or more embodiments may comprise forming the top electrode of the capacitor with electrically conductive filling material, for instance electrically conductive glue.

One or more embodiments may comprise an electrically conductive layer, for instance produced by screen printing of low temperature sintered composite materials based on microparticles (for instance, copper-silver) or jet-print-dispensing nanoparticles of electrically conductive material (for instance, copper, silver, carbon).

One or more embodiments may facilitate improved capacitance gain by a sculptured structure onto at least one capacitor electrode to increase capacitor surface.

One or more embodiments facilitate providing semiconductor devices with integrated capacitor(s) having the same size (for instance single die) of a device without such capacitor(s).

BRIEF DESCRIPTION OF THE SEVERAL VIEWS OF THE DRAWINGS

One or more embodiments will now be described, by way of example only, with reference to the annexed figures, wherein:

FIGS. 19 to 27 are perspective views exemplary of possible developments of embodiments related to a lead frame structure, wherein FIG. 23 is an enlarged view of the portion of FIG. 22 indicated by arrow XXIII, FIG. 25 is an enlarged view of the portion of FIG. 24 indicated by arrow XXV, and FIG. 26 is a cross-sectional view along line XXVI-XXVI FIG. 25.

It will be appreciated that, for sake of clarity and ease of representation, the various figures may not be drawn to a same scale.

DETAILED DESCRIPTION

In the ensuing description, one or more specific details are illustrated, aimed to providing an in-depth understanding of examples of embodiments of this disclosure. The embodiments may be obtained by one or more of the specific details or with other methods, components, materials, and so on. In other cases, known structures, materials or operations are not illustrated or described in detail so that certain aspects of embodiment will not be obscured.

Reference to "an embodiment" or "one embodiment" in the framework of the present description is intended to indicate a particular configuration, structure, characteristic described in relation to the embodiment is compliance in at least one embodiment. Hence, phrases such as "in an embodiment" or "in one (or more) embodiments" that may be present in one or more points in the present description do not necessarily refer to one and the same embodiment. Moreover, particular conformation, structures or characteristics as exemplified in connection with any of the figures may be combined in any other quite way in one or more embodiments as possibly exemplified in other figures.

The references used herein are provided merely for convenience and hence do not define the extent of protection or the scope of the embodiment.

Document US 2017/250128 A1 is exemplary of integrating a capacitor in a semiconductor device. Integrating a (high) capacitance capacitor in a semiconductor device, for instance in a semiconductor packaging, may involve tight space constraints.

One or more embodiments may be applied to manufacturing semiconductor devices (for instance integrated circuits) by resorting, for instance, to Flip-Chip (FC) technology as used, for instance, in producing Quad Flat No-Lead (QFN), QFN multi row (QFN-mr) or Thin Quad Flat Pack (TQFP) integrated circuits.

Figure 1:
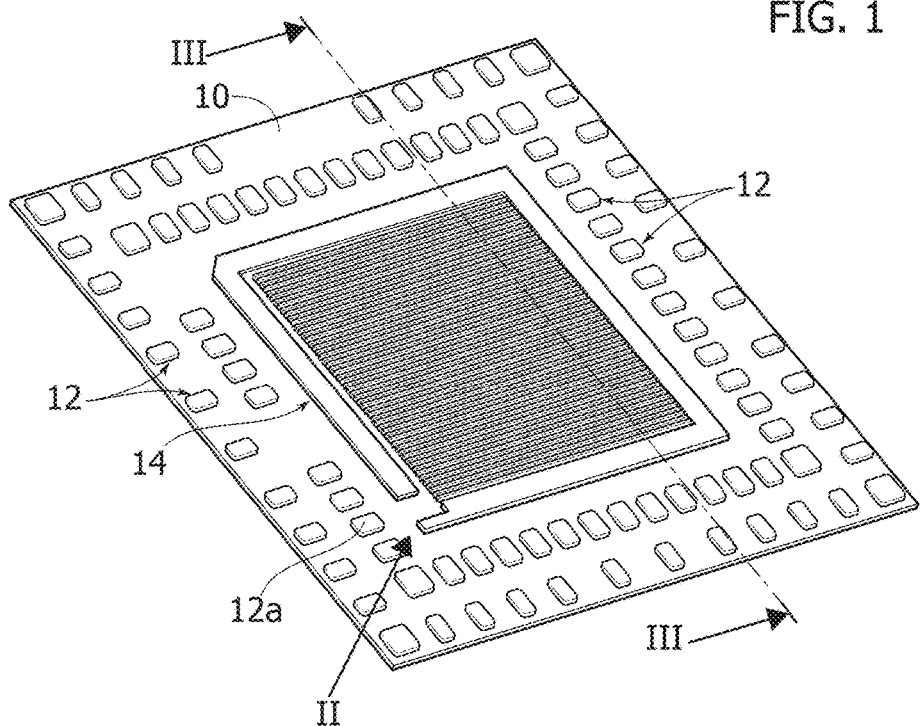
FIG. 1 is a perspective view exemplary of certain parts which may be used in producing a semiconductor device according to embodiments.

FIG. 1 is a perspective view of one or more embodiments of a (metal, for instance copper) lead-frame 10 comprising an array of electrical contact formations (or leads) 12 around a die pad 14 in the lead-frame 10 (to be eventually subjected to back-etching as discussed in the following).

In one or more embodiments, the array of electrical contact formations 12 may possibly have selectively plated parts provided thereon by known means.

Figure 2:
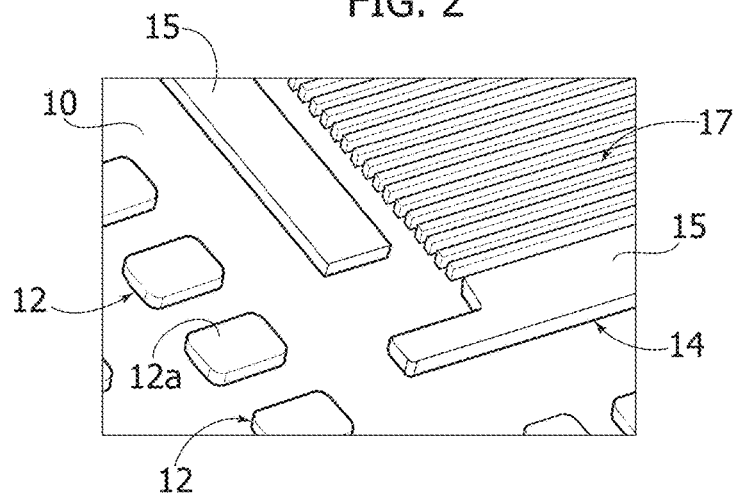
FIG. 2 is an enlarged view of the portion of FIG. 1 indicated by arrow II.
Figure 3:
FIG. 3 is a cross-sectional view along line of FIG. 1.

FIG. 2 is an enlarged view of a portion, indicated by arrow II, of FIG. 1.

In one or more embodiments as exemplified herein, the die pad 14 of the lead-frame 10 may comprise an outline portion 15 around (at least) one electrically conductive die pad area 17.

In one or more embodiments, the outline portion 15 may also be electrically conductive.

For instance, the outline portion 15 may be a ribbon-like portion of the die pad 14 outlining the electrically conductive die pad area 17. The ends of the ribbon-like portion 15 may be separated, for instance, by a gap, so that portion 15 may have an open outline, for instance, an open square outline.

In one or more embodiments, the electrically-conductive die pad area 17 may be provided via a standard etching process, for instance a chemical etching process.

In one or more embodiments, the electrically-conductive die pad area 17 may be provided with at least one sculptured structure/surface.

Such a sculptured structure/surface may facilitate increasing the surface area of the electrodes of at least one capacitor which may be integrated in a device as discussed herein.

In one or more embodiments, the sculptured structure/surface may be provided via laser etching electrically conductive area 17 in the die pad 14 of the lead-frame 10.

It is noted that such laser etching may facilitate customization of the lead-frame 10 properties as a function of different types of semiconductor die mounted, as will be discussed in the following (for instance see FIGS. 10, 18, 24).

An exemplary laser equipment for use in such a laser etching process may be the ROFIN PowerLine Pico50 available from ROFIN-SINAR Laser GmbH, Hamburg, Germany.

A grooved or slotted surface may be exemplary of such a sculptured structure/surface having valleys and peaks. For instance, the figures show exemplary embodiments of a grooved or slotted structure/surface having an interdigitated, e.g., comb-like cross-sectional profile, which may be regarded as comprising one or more spaced repetitions of a comb-like unit (see, for instance FIG. 4 and FIG. 5).

It will be otherwise appreciated that the embodiments are not limited to grooved or slotted structures/surfaces with rectilinear grooves or slots. For instance, one or more embodiments may comprise grooved or slotted patterns with curved grooves or slots, for instance, wavy or labyrinth patterns.

Also, while the embodiments exemplified herein comprise grooves or slots having a same depth (that is a uniform sculpturing depth) one or more embodiments may comprise grooves or slots with different depths, that is a non-uniform sculpturing depth.

Figure 4:
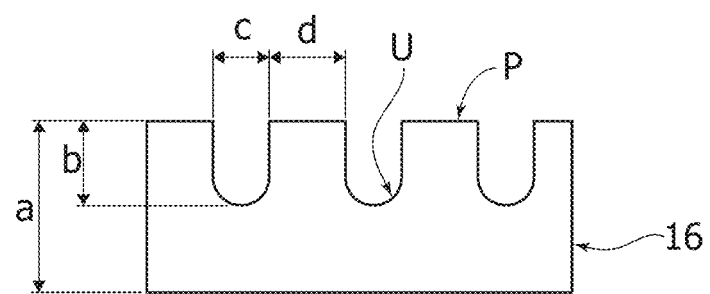
FIGS. 4 and 5 are enlarged views of possible different embodiments of the portion of FIG. 3 indicated by arrow IV.
Figure 5:
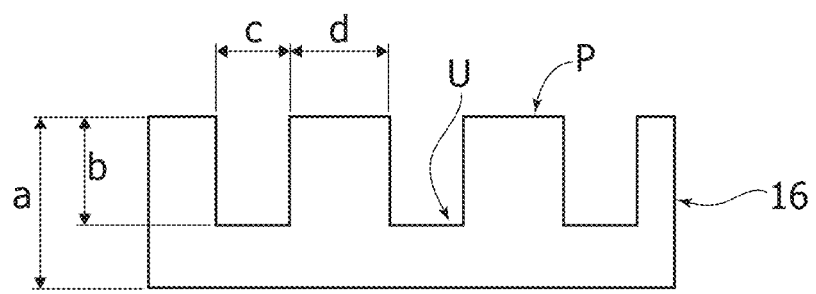

In one or more embodiments, a sculptured structure as exemplified in the FIGS. 4 and 5 may comprise a spaced repetition of valleys (recessed channels U) and peaks (top surface P), for instance a periodically spaced repetition.

FIGS. 4 and 5 are exemplary of possible sizing (height and width) of the sculpturing of the electrically conductive die pad area 17, for instance, when etched with standard etching processes such as a chemical etching process (FIG. 4) or laser etching (FIG. 5) assuming a non-etched lead-frame thickness "a" of, for instance, 0.15 mm.

As exemplified in FIG. 4, the valleys U may have a depth "b" of, for instance, 0.07 mm and a width "c" equal to, for instance, 0.05 mm. The peaks P may have a width "d" (at the top) of, for instance, 0.05 mm.

As exemplified in FIG. 5, the valleys U may have a depth "b" of, for instance, 0.1 mm and a width "c" equal to, for instance, 0.06 mm. The peaks P may have a width "d" (at the top) of, for instance, 0.07 mm.

Of course, the values indicated are merely exemplary and non-limiting of the embodiments.

Figure 6:
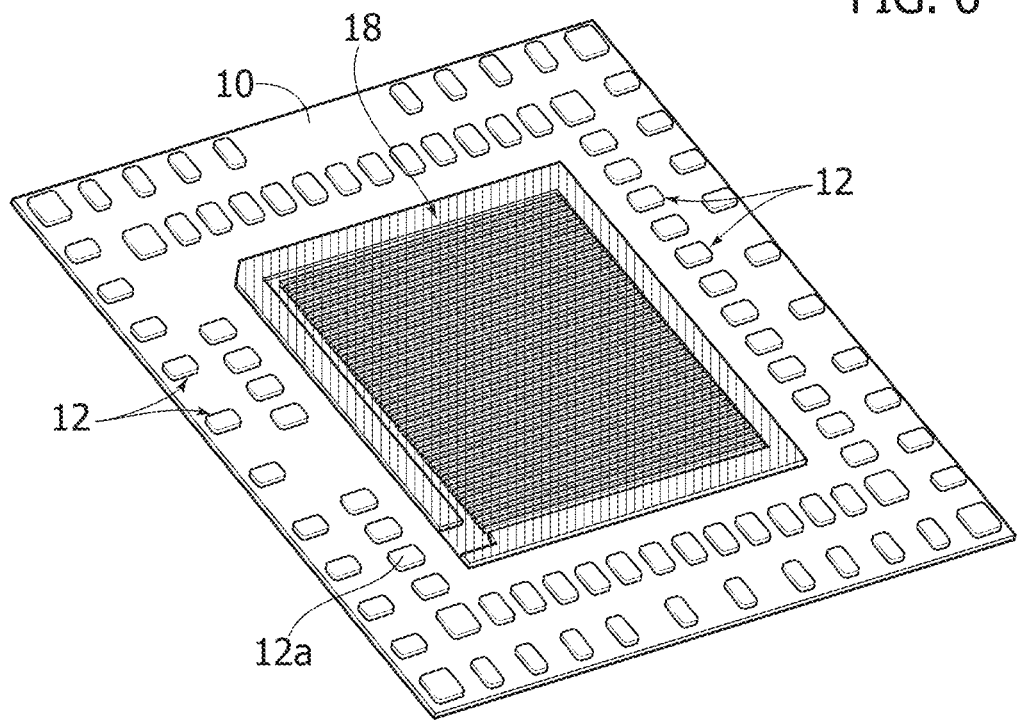
FIG. 6 is a perspective view exemplary of certain processing which may be applied to the parts exemplified in FIG. 1.
Figure 7:
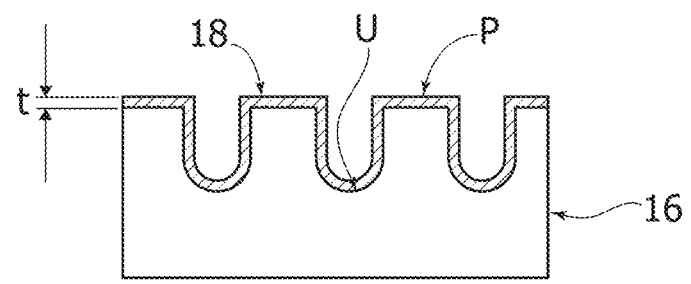
FIG. 7 is an enlarged view exemplary of a possible result of applying the processing exemplified in FIG. 6 to the structure exemplified in FIG. 4.

FIGS. 6 and 7 are exemplary of certain processing which may be applied to the parts exemplified FIG. 1: of these, FIG. 6 is a perspective view similar to the one of FIG. 1 and FIG. 7 is an enlarged view exemplary of a possible result of applying the processing exemplified in FIG. 6 to the structure exemplified in FIG. 4.

In one or more embodiments, a (thin) insulating layer 18 may be applied onto the electrically conductive area 17 in the die pad 14. Accordingly, the insulating layer 18 may have a profile following the profile of valleys U and peaks V sculptured onto the surface of the electrically conductive die pad area 17.

In one or more embodiments, the insulating layer 18 may be applied, for instance by jet printing.

In one or more embodiments, the insulating layer 18 may comprise a layer of at least one (curable) dielectric material.

A first exemplary dielectric material which may be used in one or more embodiments is the product available under the trade designation DuPont LuxPrint 8153 with DuPont Microcircuit Materials of Research Triangle Park, N.C., USA.

Another exemplary dielectric material which may be used in one or more embodiments is the product available under the trade designation 111-27 with Creative Materials, Inc. of Ayer, Mass., USA.

Still another exemplary dielectric material which may be used in one or more embodiments is the product available under the trade designation Cerablak HTP by Applied Thin Films, Inc., IL, USA.

In one or more embodiments, the insulating layer 18 may desirably comprise a dielectric material having a high dielectric constant, for instance of the order of magnitude of the carbon dielectric constant.

An exemplary dielectric material for use in one or more embodiments may comprise a water-based carbon resistive coating product sold under the trade name of ANTISTAT-268 by Applied Ink Solutions, Mass., USA.

In one or more embodiments, the insulating layer 18 applied on the area 17 may be cured by a standard curing process, for instance UV curing or heat curing.

For instance, the thickness of the insulating layer 18 may have values below 1 micron (1 micron=$10^{-6}$ m).

Figure 8:
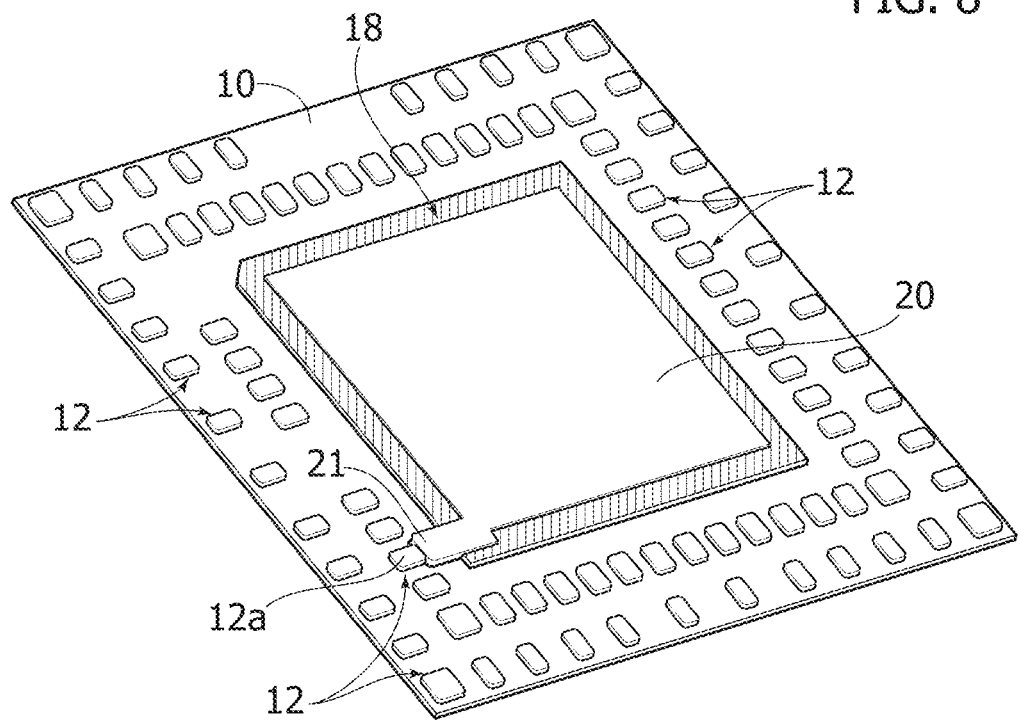
FIG. 8 is a perspective view exemplary of certain processing which may be applied to the parts exemplified in FIG. 6.

FIG. 8 is exemplary of one or more embodiments of an electrically conductive layer 20 applied onto the assembly of FIG. 6, for instance over (the whole or a portion of) the sculptured area 17 having the insulating layer 18 applied thereon.

In one or more embodiments, the electrically conductive layer 20 may comprise electrically conductive material adapted to fill the cavities in the sculptured surface of the area 17.

In one or more embodiments, the electrically conductive layer 20 may comprise electrically conductive adhesive material, for instance a conductive glue with a silver powder filler.

In one or more embodiments, the electrically conductive layer 20 may be applied onto the insulating layer 18, for instance, by screen printing.

In one or more embodiments, the insulating layer 18 may thus be sandwiched between the electrically conductive die pad area 17 and the electrically conductive layer 20 to form a capacitor integrated in the device as discussed herein.

It will be otherwise appreciated that the sculptured die pad area 17, the electrically conductive layer 20 and the insulating layer 18 sandwiched therebetween need not necessarily be completely overlapping.

It is noted that any arrangement of the conductive layer 20 onto the assembly may be possible, as well as any arrangement of a semiconductor die 22 onto the conductive layer 20, within the precision limits of the technological deposition process.

For instance, conductive layer applications may have a precision of +/−0.1 mm while device placement may have a precision of +/−0.15 mm (1 mm=$10^{-3}$ m).

For instance, as visible in FIGS. 6 and 8, the insulating layer 18 may extend (also) over the outline portion 15 with the electrically conductive layer 20 applied thereon leaving uncovered a peripheral portion of the insulating layer 18.

In one or more embodiments, the electrically conductive layer 20 may extend into (that is "fill") the valleys U while also covering the peaks P of the sculptured structure of the area 17.

Accordingly, as seen in a top view, the electrically conductive layer 20 may appear as an essentially uniform surface. Conversely, at the side facing the electrically conductive die pad area 17 (with the insulating layer 18 sandwiched therebetween) the electrically conductive layer 20 may exhibit a sculptured structure essentially complementary to the sculptured structure of the electrically conductive die pad area 17.

As noted, the electrically conductive die pad area 17, the electrically conductive layer 20, and the insulating layer 18 sandwiched therebetween form at least one integrated capacitor (comprising the integers 17, 18 an 20) having a "bottom" electrode comprising the electrically conductive die pad area 17 and a "top" electrode comprising the electrically conductive layer 20.

Advantageously, the sculptured structure/surface in the die pad area 17 (reproduced in a complementary way by the electrically conductive layer 20 filling the valleys U in the die pad area 17) facilitates increasing the surface area of the electrodes 17, 20 of the capacitor without increasing the capacitor occupancy.

In one or more embodiments, such a sculptured structure facilitates obtaining high capacitance values, for instance in the range of nanoFarads (1 nanoFarad=$10^{-9}$ F) for the integrated capacitor 17, 18, 20.

As noted, the conductive layer/top electrode 20 may be obtained by applying (for instance screen printing, injecting) an electrically conductive filling material, optionally comprising adhesive material, onto the insulating layer 18. Thus, the top electrode may also have a comb-like sculptured structure, for instance interdigitated with the comb-like sculptured structure in the bottom electrode.

In one or more embodiments, the electrically conductive layer 20 may be configured to comprise at least one extension 21, for instance a "track", coupling the electrically conductive layer 20 with the electrical contact formation 12*a* discussed in the foregoing.

In one or more embodiments, the extension 21 may be obtained by applying (for instance screen printing, injecting), again, an electrically conductive filling material, optionally comprising adhesive material, onto (at least) a portion of the lead-frame 10 which will be eventually subjected to back-etching.

The extension 21 may facilitate electrical coupling to the array of electrical contact formations 12, of the "top" electrode (that is, the electrically conductive layer 20) of the integrated capacitor 17, 18, 20 (that is, the capacitor comprising the electrically conductive die pad area 17, the insulating layer 18 and the electrically conductive layer 20).

Figure 9:
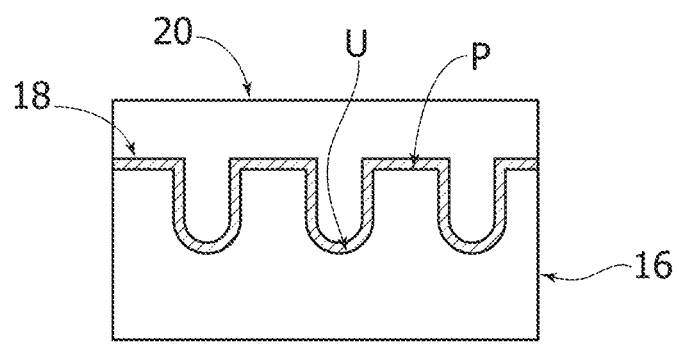
FIG. 9 is an enlarged view exemplary of a possible result of applying the processing exemplified in FIG. 8.

FIG. 9 is an enlarged view exemplary of a possible result of applying the processing exemplified in FIG. 8 on the comb-like unit 16 of the electrically conductive die pad area 17.

Figure 10:
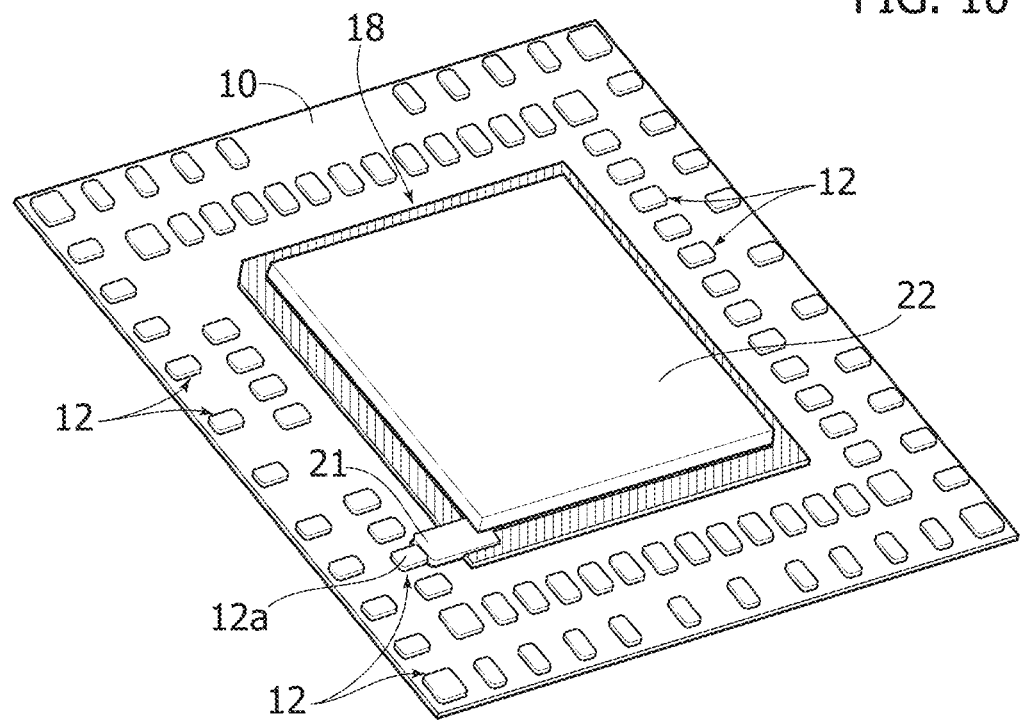
FIG. 10 is a perspective view exemplary of certain processing which may be applied to the parts exemplified in FIG. 8.

FIG. 10 is exemplary of the possibility of arranging one or more semiconductor dice 22 onto the assembly of FIG. 8, that is onto the electrically conductive layer 20 (namely, with the semiconductor die or dice 22 arranged "on top" of the integrated capacitor 17, 18, 20).

In the following discussion, only one semiconductor die 22 will be shown and considered for simplicity, however, any number of semiconductor dice may be provided.

As discussed previously, in one or more embodiments, the electrically conductive layer 20 may comprise adhesive material. This may facilitate adhesively coupling the semiconductor die/dice 22 to the electrically conductive layer 20.

In one or more embodiments, the electrically conductive layer 20 may comprise curable material.

In one or more embodiments, the semiconductor die/dice 22 may be mounted onto a still un-cured electrically conductive layer 20.

Optionally, the semiconductor die/dice 22 may be mounted onto the electrically conductive layer 20 by other means, known to those of skill in the art.

Figure 11:
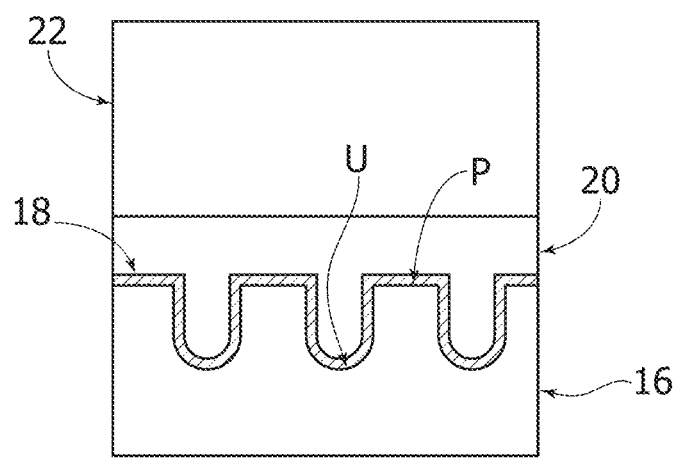
FIG. 11 is an enlarged view exemplary of a possible result of applying the processing exemplified in FIG. 10.

FIG. 11 is an enlarged view (again referred to a comb-like unit 16 as visible in FIG. 4) of a possible result of mounting the semiconductor die/dice 22 onto the conductive layer 20.

Figure 12:
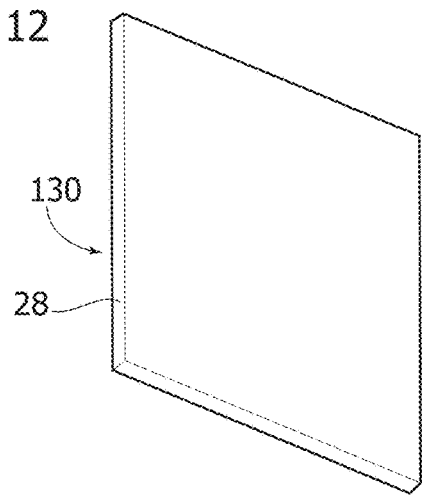
FIG. 12 is an exemplary perspective view of a packaged semiconductor device according to embodiments.
Figure 13:
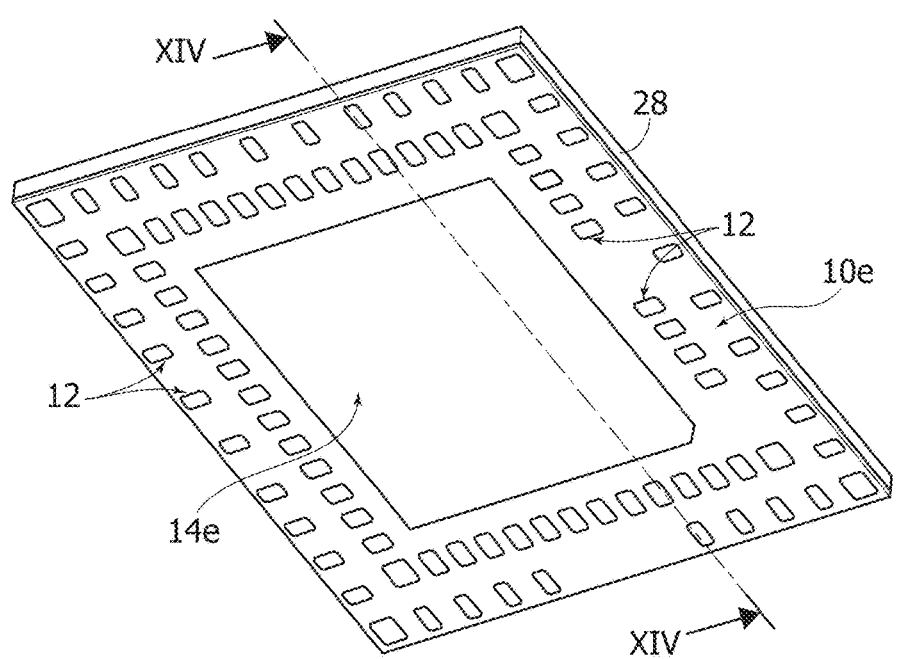
FIG. 13 is an exemplary perspective view according to an observation point essentially opposite the observation point of FIG. 12.
Figure 14:
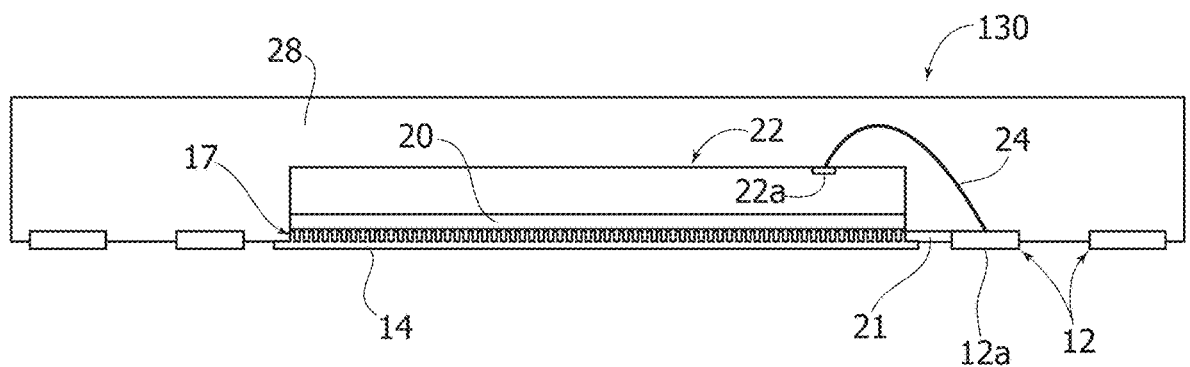
FIG. 14 is a cross-sectional view along line XIV-XIV of FIG. 13.
Figure 15:
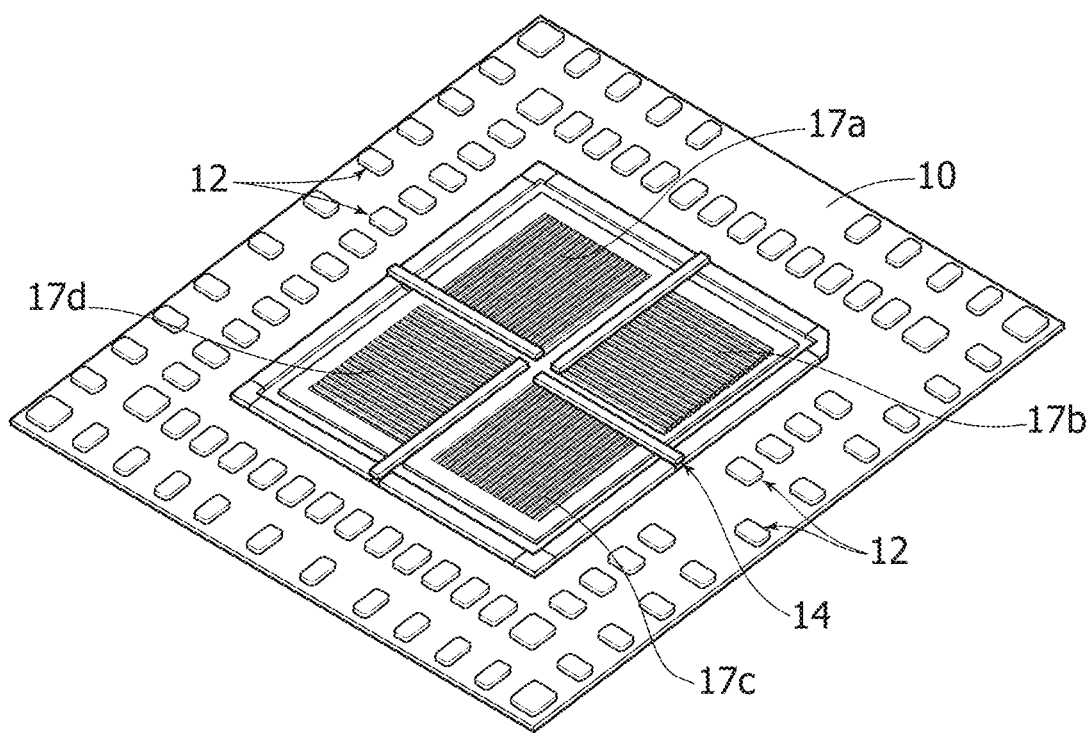
FIGS. 15 to 18 are perspective views exemplary of possible developments of embodiments.
Figure 16:
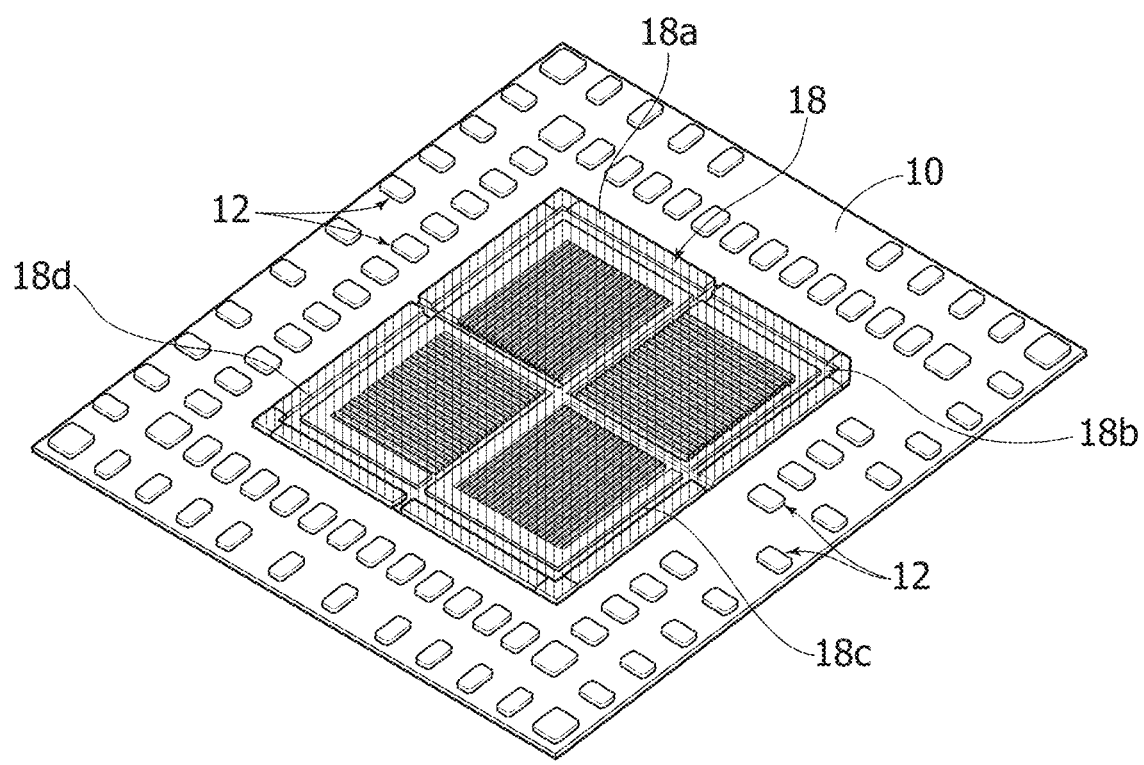
Figure 17:
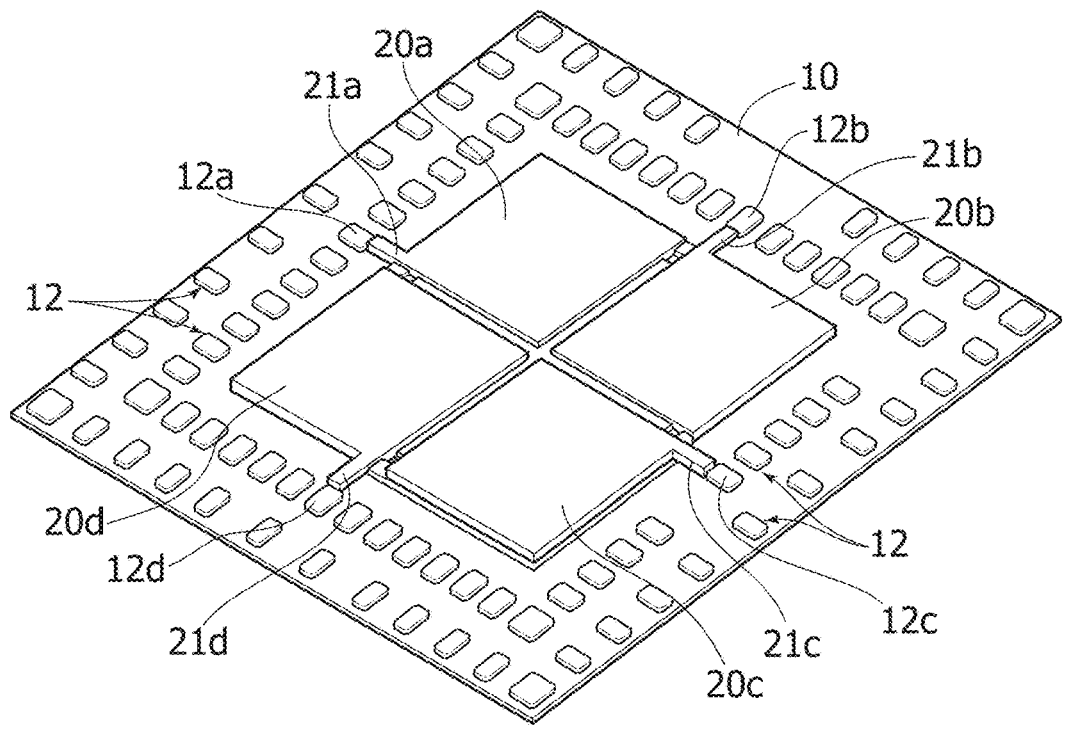

FIGS. 12 to 14 are exemplary of a semiconductor device 130 comprising a package 28, provided for instance by molding an electrically insulating package molding compound (PMC) onto the assembly of FIGS. 10 and 11 with an etching process (of any type known to those of skill in the art for that purpose) applied to a back surface 10*e* of the lead-frame 10 having the package 28 molded thereon.

The etching process at the back surface 10*e* ("back-etching") may form individual pins from the electrically conductive formations 12 (possibly including the formation 12a) of the lead-frame 10 and may expose a die pad back-side 14e.

As exemplified on the right-hand side of FIG. 14, in one or more embodiments, at least one portion of the electrically conductive layer 20, for instance one or more extensions 21 may couple one or more electrically conductive contact areas 12a of the lead-frame 10 with the capacitor formed by the electrically conductive layer 20, the conductive die pad area 17 (with the insulating layer 18 sandwiched therebetween, not visible in FIG. 14 for reasons of scale).

In one or more embodiments, the semiconductor die 22 may have electrical contact pads 22a (see for instance FIG. 14) configured to be coupled to:

the lead-frame 10, for instance one the contact formations 12;

the integrated capacitor 17, 18, 20.

In one or more embodiments, coupling of the contact pads 22a to the lead-frame 10 may be via wire-bonding formations 24 (provided by any known process for that purpose).

FIGS. 15 to 27 are exemplary of various features which may be included, singly or in combination, in one or more embodiments. Parts or elements like parts or elements already discussed in the foregoing are indicated with the like references, thus making it unnecessary to repeat the detailed description herein.

Also, it will be appreciated that features exemplified herein in connection with embodiments illustrated in a certain one of the figure may be included, singly or in combination, in embodiments illustrated in any other one of the figures.

For instance, FIGS. 15 to 18 are exemplary of embodiments comprising a plurality of sculptured structures in a plurality of electrically conductive areas 17a-17d in the die pad 14, for instance four electrically conductive areas 17a-17d in the die pad 14, having valleys U and peaks P therein as discussed previously.

In one or more embodiments, the plurality of electrically conductive die pad areas (for instance four areas 17a-17d, such a quantitative figure being in no way mandatory) may differ from one another for their sizes (surface areas).

In one or more embodiments, the plurality of electrically conductive die pad areas 17a-17d may differ from one another due to a different orientation of the valleys U and peaks P therein, as provided, for instance by rectilinear grooves oriented mutually orthogonally in adjacent areas.

For instance (as visible for instance in FIG. 15):

the grooves in area 17b may be orthogonal to those in area 17a;

the grooves in area 17c may be orthogonal to those in area 17b;

the grooves in area 17d may be orthogonal to those in area 17c; and the grooves in area 17a may be orthogonal to those in area 17d).

Stated otherwise, the sculptured portions in die pad areas 17a-17d in the die pad 14 may comprise mutually-rotated scaled replicas of a same sculptured structure in a square matrix-like arrangement.

Of course, the foregoing is just an example of possible different orientations in embodiments.

In one or more embodiments, the sculptured portions in die pad areas 17a-17d may have a sculptured comb-like profile with the same height, width and distance between peaks P and valleys U.

In one or more embodiments, the sculptured portions in die pad areas 17a-17d may differ from one another for their surface areas and various sizes, for instance height and width a, b, c, d, e, and/or shapes of the valleys U and peaks P therein, thus having different height, width and/or distance between peaks P and valleys U.

For instance, in one or more embodiments, the sculptured portions in die pad areas 17a-17d may have respective sculptured structure portions which are mutually mirror-symmetrical.

In One or More Embodiments:

a single insulating layer 18 may be applied on the sculptured portions in die pad areas 17a-17d; or respective distinct portions 18a-18d of insulating layer 18 may be applied on the sculptured portions in areas 17a-17d.

Similarly, in one or more embodiments:

a single electrically conductive layer 20 may be provided extending over the sculptured portions in die pad areas 17a-17d; or respective distinct electrically conductive (layer) portions 20a-20d in the electrically conductive layer 20 may be provided extending over respective the sculptured portions in areas 17a-17d for instance forming a given number of "lands".

Both these latter options can be combined with a single insulating layer 18 or with distinct portions 18a-18d of insulating layer 18.

The various possibilities just discussed facilitate providing a plurality of capacitors integrated in the device 130 which may be either fully distinct from one another (for instance 17a, 18a, 20a; 17b, 18b, 20b; 17c, 18c, 20c; 17d, 18d, 20d) or may share common portions of "top" and "bottom" electrodes in a parallel arrangement.

Moreover, due to factors such as their sizes (surface areas) and the morphology (for instance height and width a, b, c, d, e, and/or shapes of the valleys U and peaks P therein) the plurality of integrated capacitors may have respective capacitance values (possibly different from one another) thus facilitating obtaining a plurality of integrated capacitors, for instance with different values of capacitances.

Whatever the options adopted in that respect, the plurality of electrically conductive layer portions 20a-20d may be in a (for instance, square) matrix-like arrangement and separated by a cross-like pattern of gaps, thus leaving a cross-shaped portion (for instance, of the insulating layer 18 or the electrically conductive die pad area 17) exposed forming a channel between the capacitors.

In one or more embodiments, the cross-shaped portion/channel may thus be filled by electrically insulating material, as discussed with reference to the package 28.

Such an exposed cross-shaped portion of the insulating layer 18 may facilitate providing electrical insulation between a plurality of electrically conductive (layer) portions 20a-20d, forming a plurality of top electrodes of a plurality of integrated capacitors.

In one or more embodiments, the plurality of electrically conductive portions 20a-20d may comprise respective extensions 21a-21d, for instance electrically conductive (filling material) "tracks", coupled to electrical contact formations 12a-12d in an array of electrical contact formations 12 to facilitate electrically coupling the plurality of integrated capacitors to corresponding contact pins essentially as discussed previously in connection with the provision of a single integrated capacitor 17, 18, 20 in the device.

Figure 18:
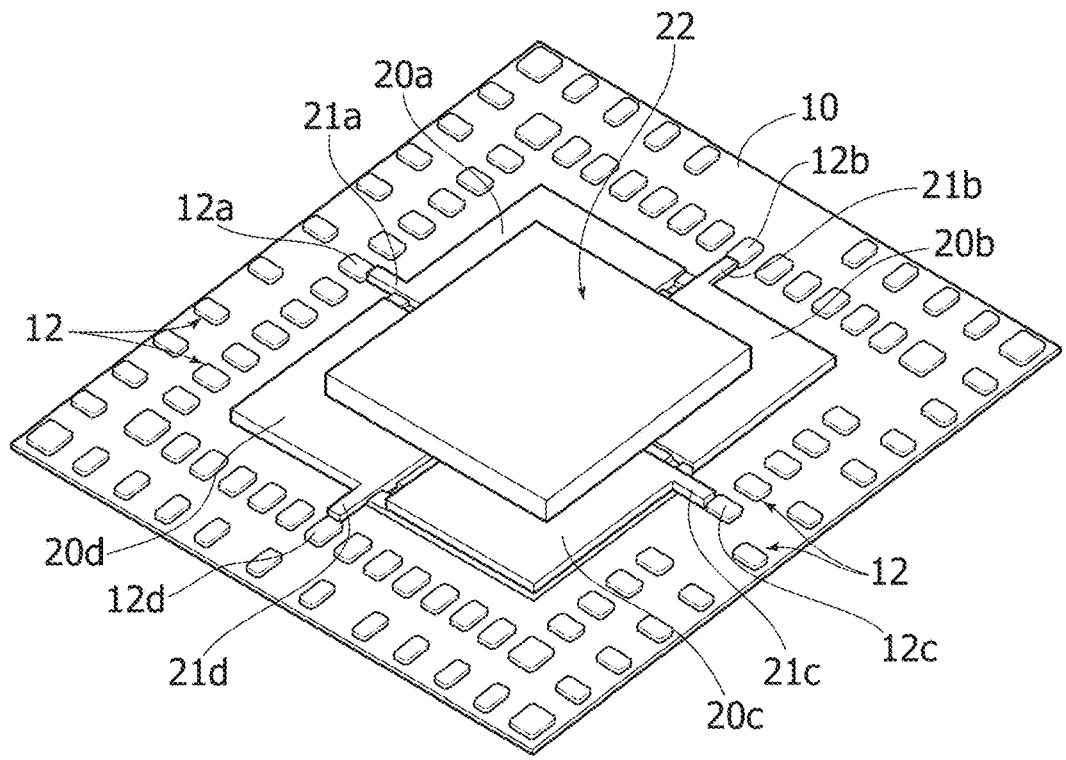
Figure 19:
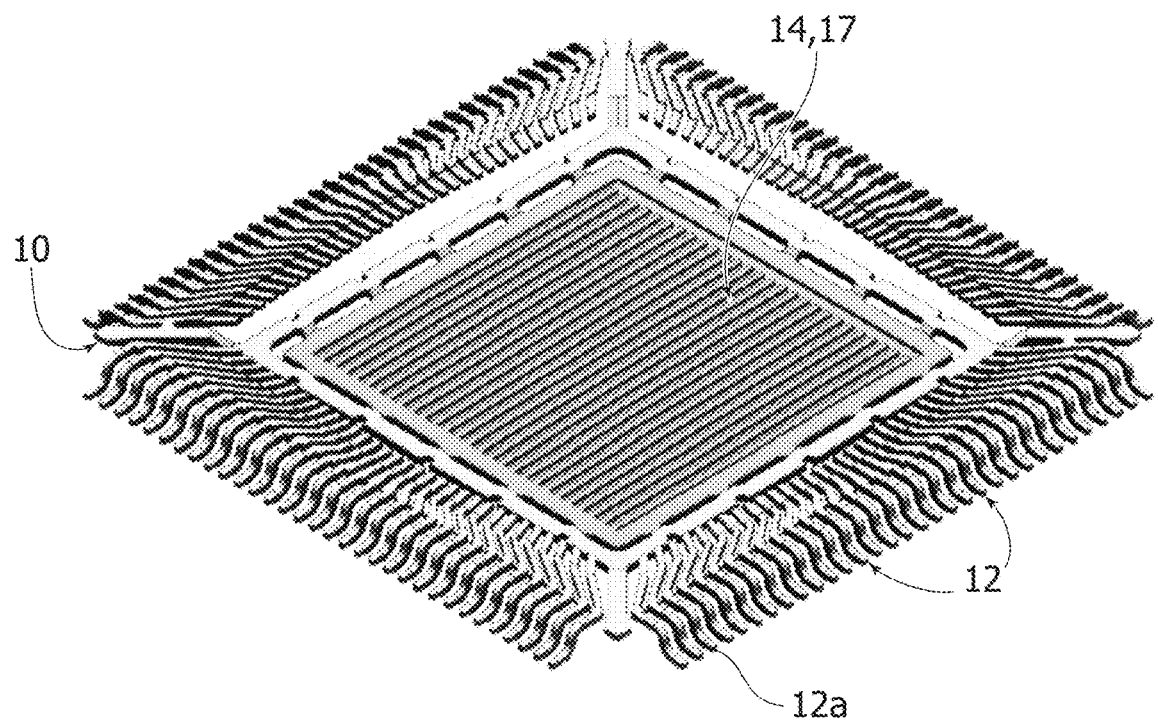
Figure 20:
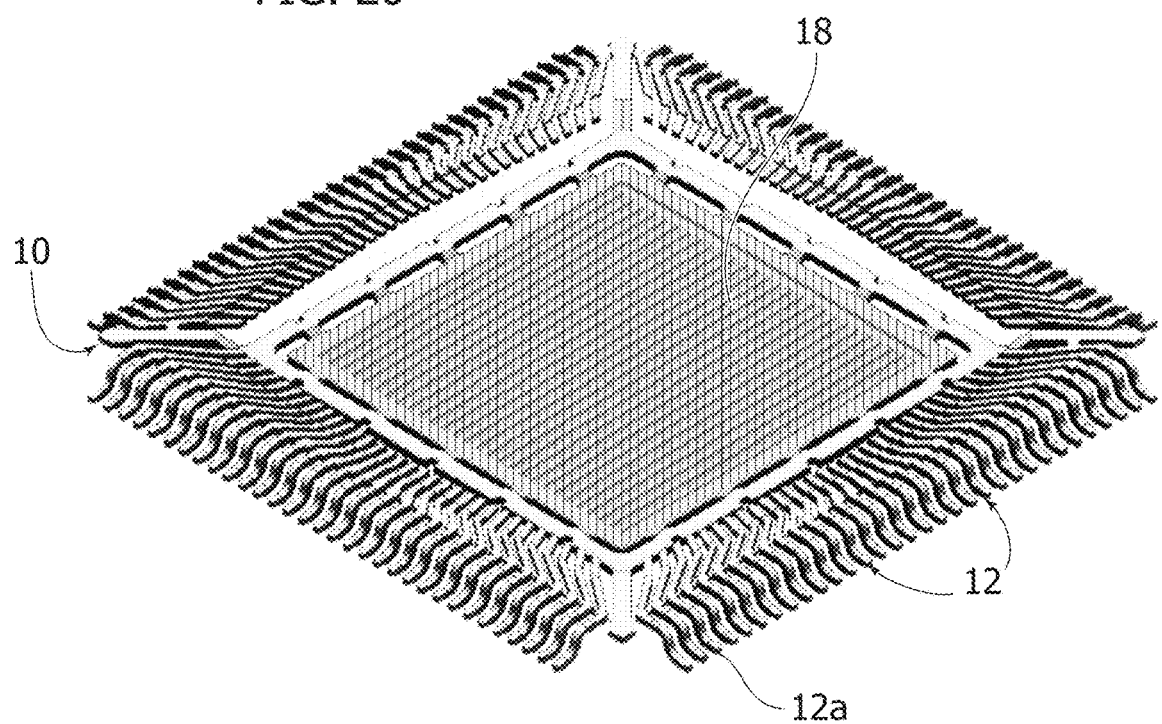
Figure 21:
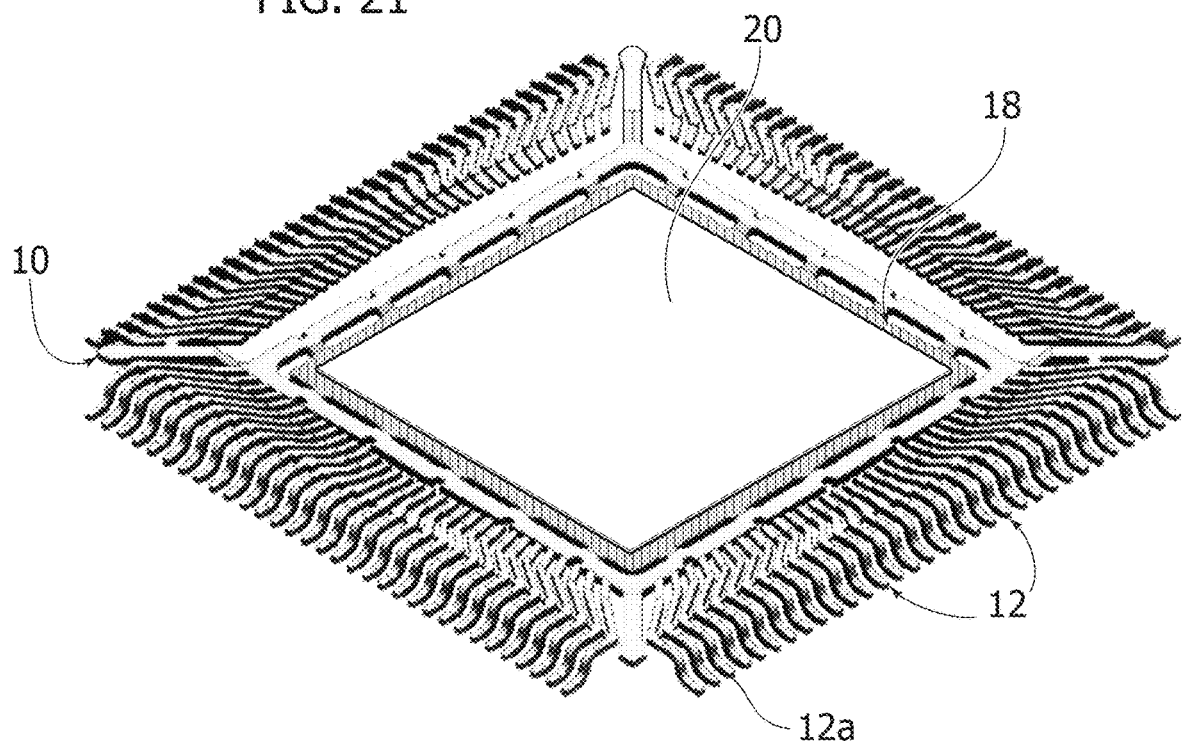

FIG. 18 is exemplary of embodiments wherein a semiconductor die 22 is mounted as discussed previously onto the plurality of electrically conductive portions 20a-20d. Again, while a single semiconductor die 22 is shown for simplicity, plural semiconductor dice 22 can be provided (for instance one for each portion 20a-20d).

As discussed previously in connection with the provision of a single integrated capacitor 17, 18, 20 in the device 130, the electrically conductive portions 20a-20d may comprise adhesive material (to facilitate adhesive attachment of the die/dice 22) and/or material still un-cured when mounting the die/dice 22.

FIGS. 19 to 27 are exemplary of one or more embodiments wherein the same criteria exemplified in the foregoing may be applied to a different type of lead frame 10, for instance a Thin Quad Flat Package (TQFP) lead-frame.

In one or more embodiments, the lead-frame 10 may comprise an array of electrical contact formations 12, around the die pad 14, for instance "wing shaped" leads extending from the sides of the die pad 14.

Again, parts or elements like parts or elements already discussed in the foregoing are indicated with the like references, thus making it unnecessary to repeat the detailed description herein.

Also, it will be once more appreciated that features exemplified herein in connection with embodiments illustrated in a certain one of the figure may be included, singly or in combination, in embodiments illustrated in any other one of the figures.

FIGS. 22 to 26 are representative of embodiments including bonding, via an (at least one) wire bonding formation 24, the semiconductor die/dice 22 to at least one electrically conductive formation in the array 12.

Figure 22:
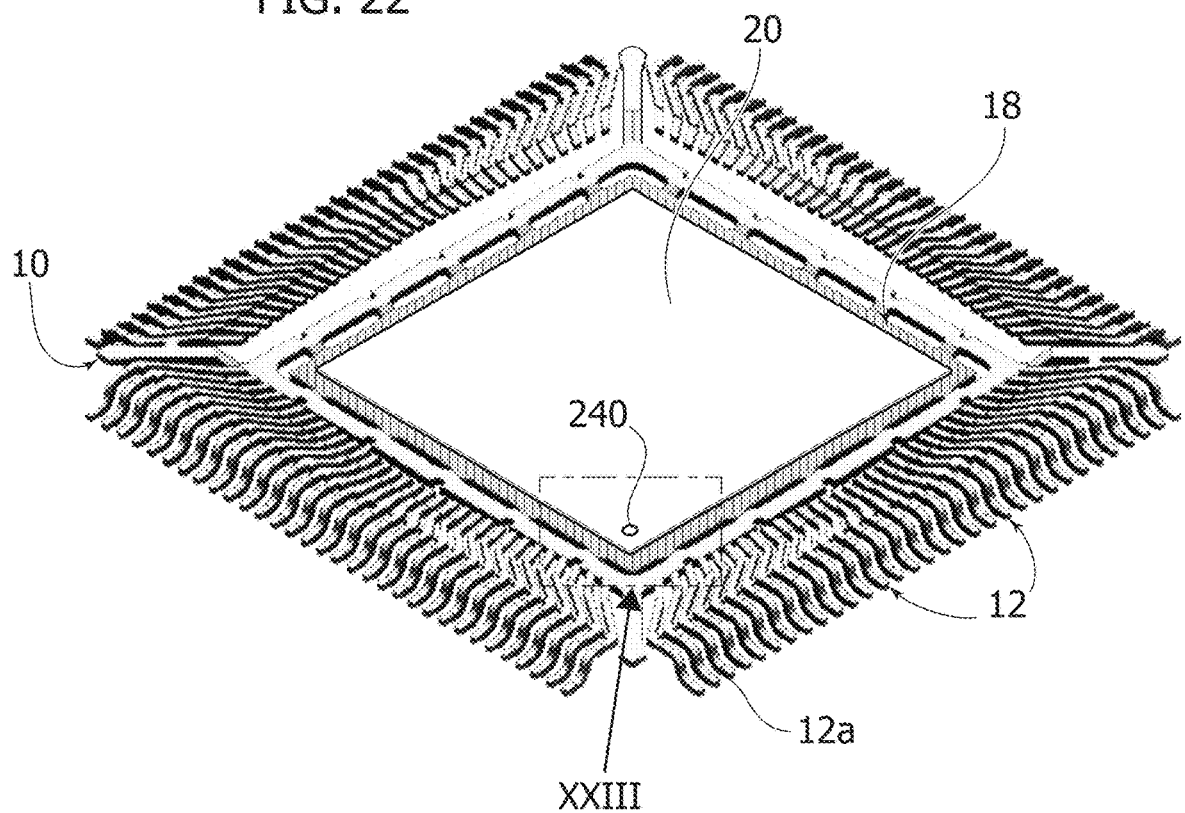
Figure 23:
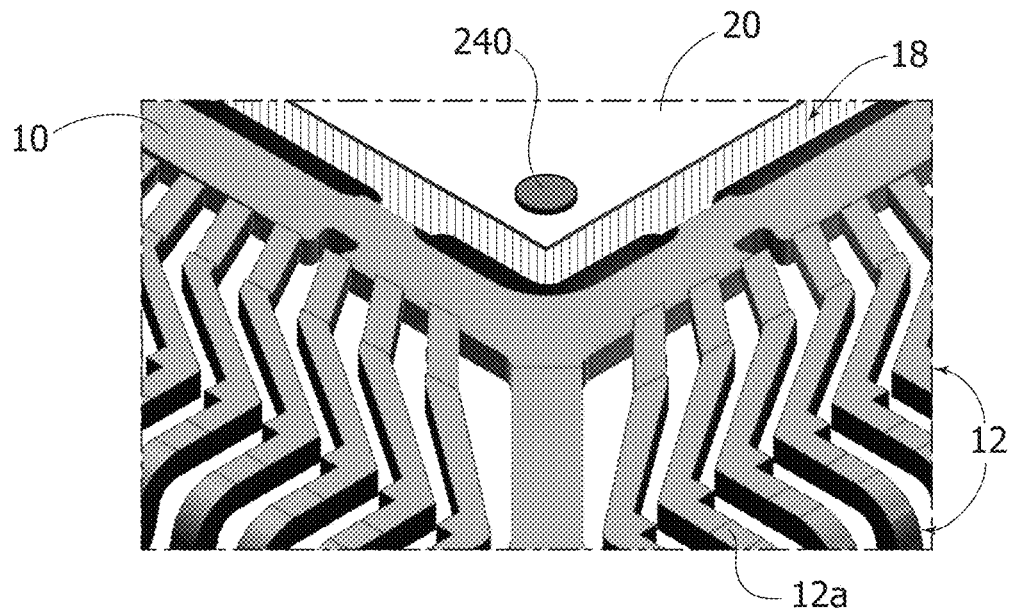
Figure 24:
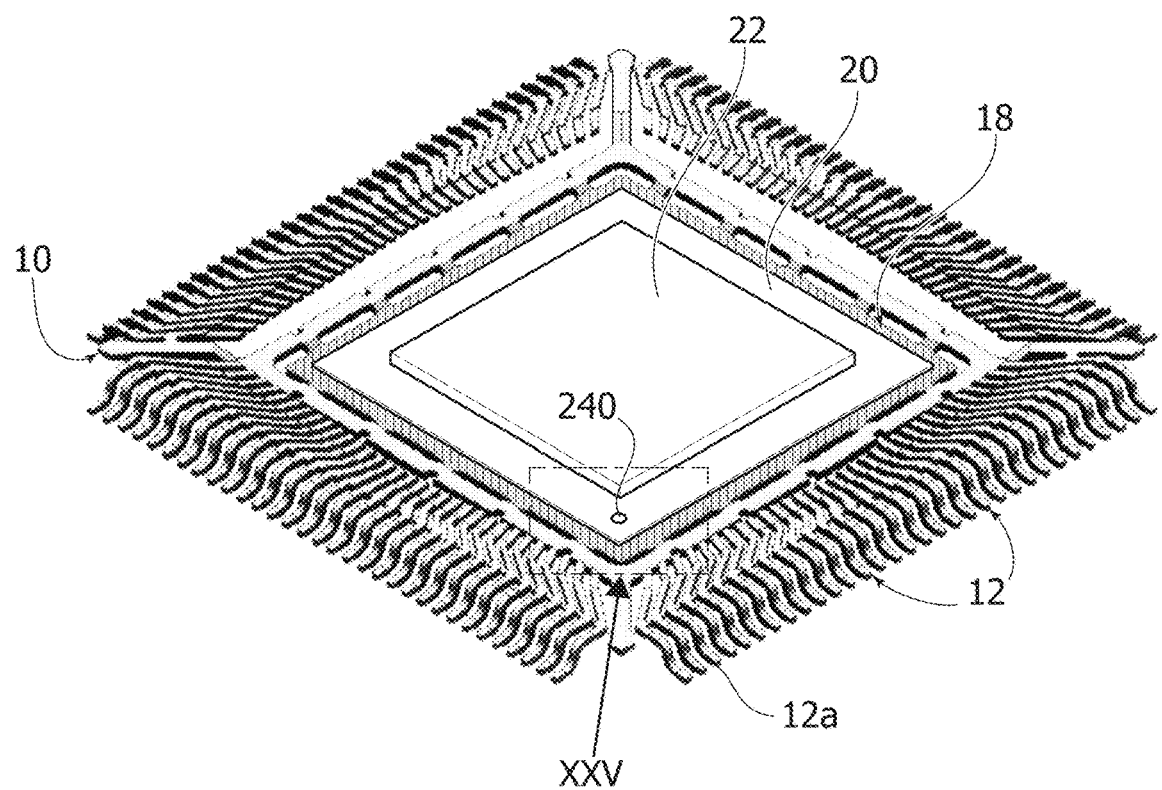
Figure 25:
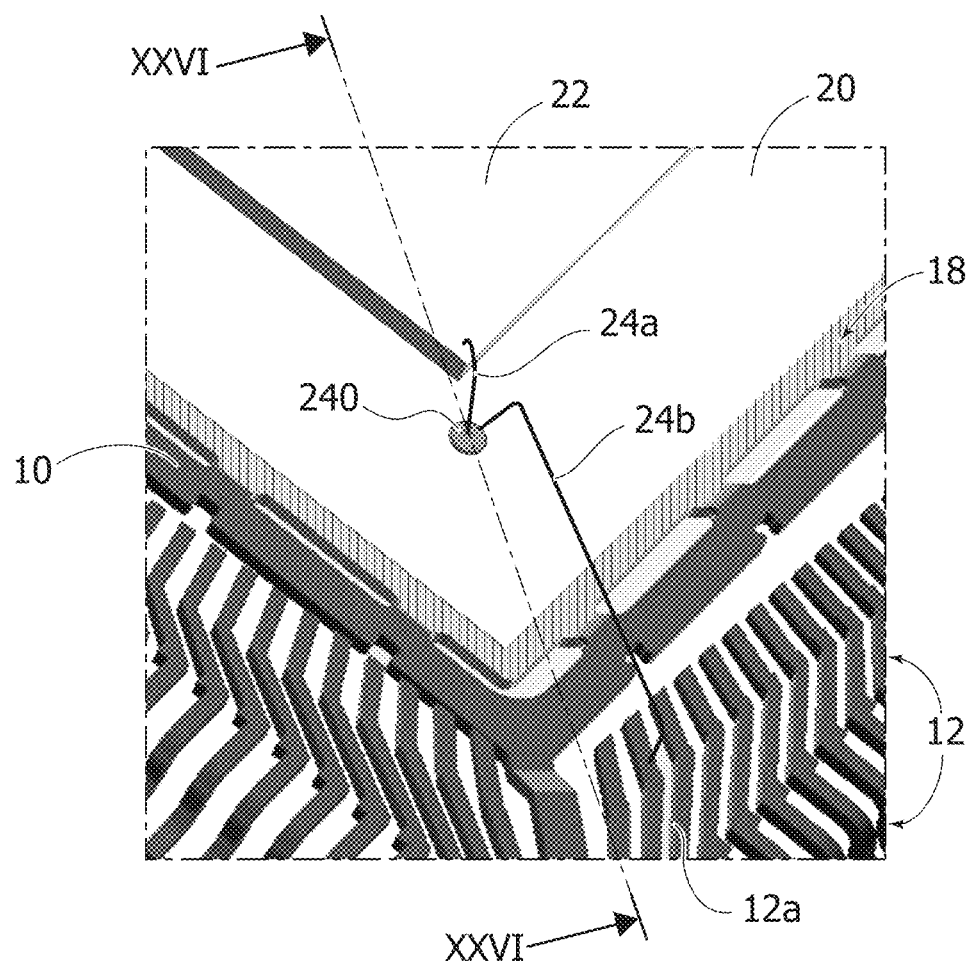
Figure 26:
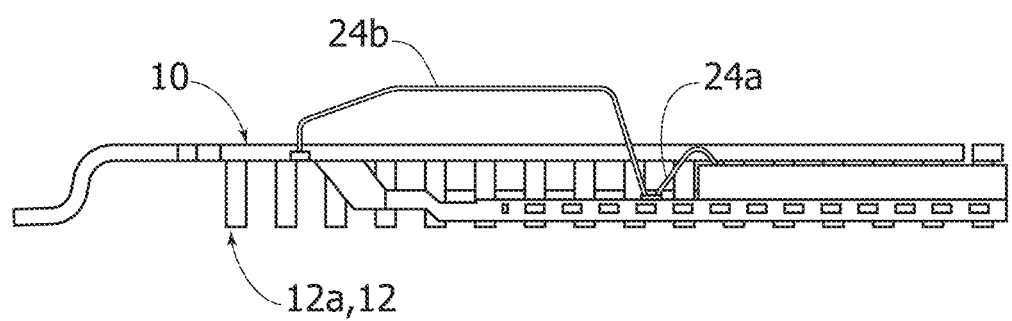

In one or more embodiments as exemplified in FIGS. 22 to 24, a (wire bond) pad 240 of electrically conductive material, for instance a copper disk or cylinder, may be applied onto the (for instance, still uncured) electrically conductive layer 20, by any known processes for this purpose.

With at least one semiconductor die 22 applied onto the electrically conductive layer 20, wire bonding may be performed to facilitate forming an electrical bond 24 by means of:
a first electrical bond 24a, coupling one of the electrical contact leads 12 of the lead-frame 10 to the (wire bond) pad 240; and
a second electrical bond 24b coupling the (wire bond) pad 240 to a contact 22a of the semiconductor die 22.

Figure 27:
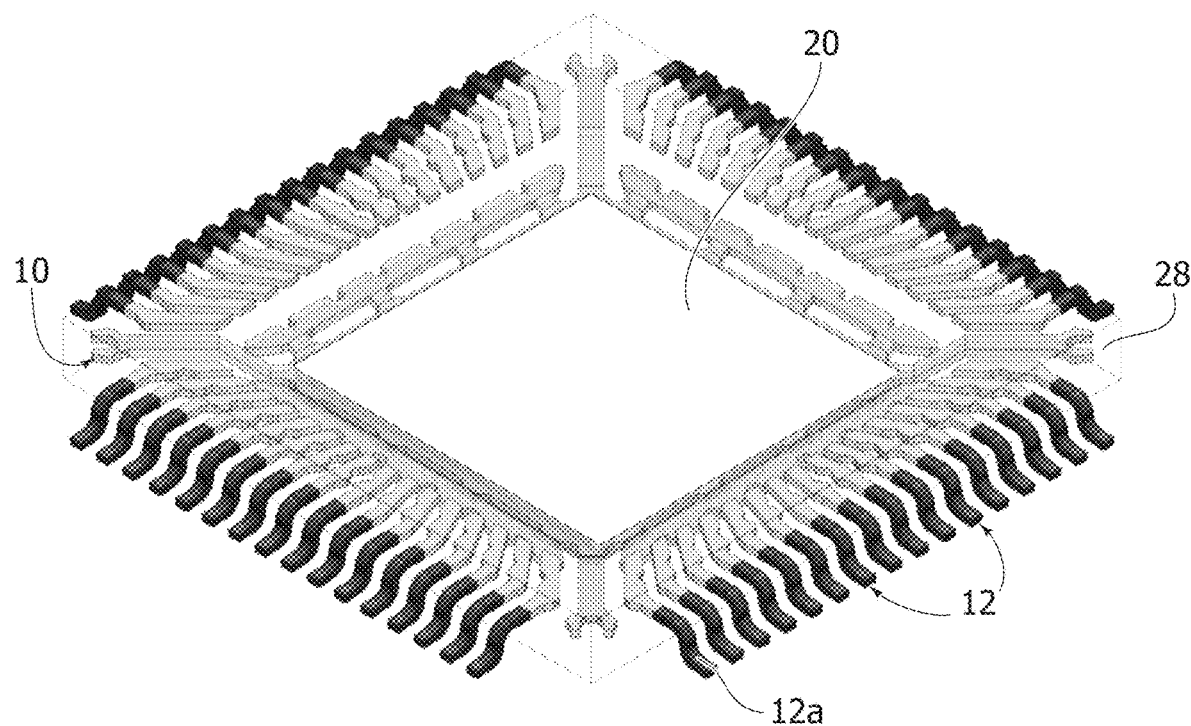

FIG. 27 is exemplary of the provision of a package 28 onto the arrangement discussed previously. The outline of the package 28 is shown in shadow line with the die/dice 22 not visible for simplicity.

Figure 28:
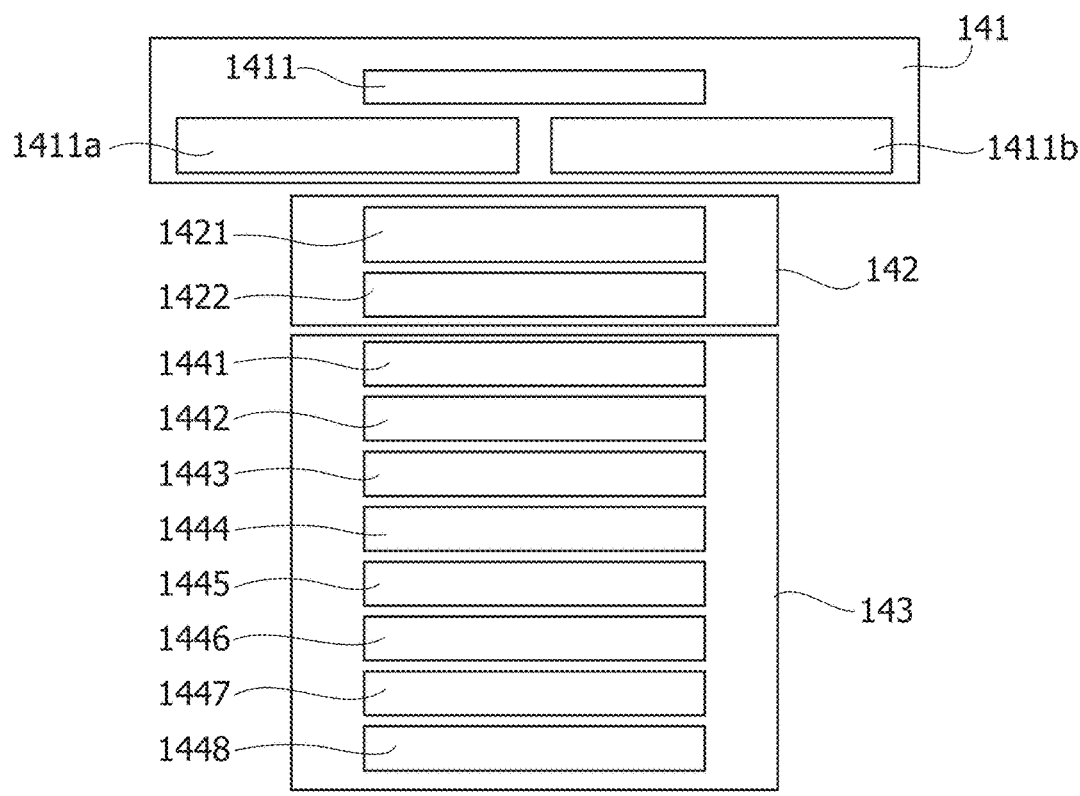
FIG. 28 is a functional diagram exemplary of methods according to embodiments.

FIG. 28 is a diagram exemplary of a method for manufacturing a semiconductor device 130 having the characteristics exemplified in the foregoing.

In one or more embodiments, the method may include a first set of acts 141 comprising:
providing a (metal, for instance copper) lead-frame 10, having an array of electrical contact formations 12, and at least one electrically conductive die pad area 17 in the die pad 14 (block 1411 in FIG. 28),
etching, for instance chemical etching 1412a or laser etching 1412b, the electrically conductive die pad area 17 in the die pad 14 of the lead-frame 10, for instance by forming therein a sculptured comb-like structure.

In one or more embodiments, a second set of acts 142 of the method exemplified in FIG. 28 may comprise forming the insulating layer 18, for instance by one of jet printing, spraying or aerosol deposition of dielectric material, onto the electrically conductive die pad area 17 in the die pad 14 of the lead-frame 10.

For instance, the second set of acts 142 may comprise:
1421: forming, for instance via printing/spraying or aerosol, an insulating material, for instance a curable dielectric material, on the electrically conductive die pad area 17 in the die pad 14 of the lead-frame 10;
1422: curing, for instance via UV or heat curing, the insulating material, thus forming an insulating layer 18 having a reduced thickness and a same sculptured pattern of the electrically conductive die pad area 17 in the die pad 14 of the lead-frame 10.

In one or more embodiments, a third set of acts 144 of the method may comprise:
1441: forming the electrically conductive layer 20 on the insulating material 18, for instance the conductive layer comprising electrically conductive adhesive curable material, thus forming at least one integrated capacitor onto which at least one semiconductor die 22 is placed;
1442: curing (for instance oven curing) the electrically conductive layer 20 thus attaching the die 22 onto the integrated capacitor 17, 18, 20;
1443: plasma cleaning by any known means for that purpose;
1444: providing wire-bonding 24;
1445: plasma cleaning by any known means for that purpose;
1446: molding the package 28;
1447: post mold curing;
1448: providing at least one semiconductor device 130, for instance by saw singulation, having at least one integrated capacitor, the semiconductor device 130, adapted to be mounted on a substrate such as a printed circuit board.

In one or more embodiments, a semiconductor device (for instance, 130), may comprise:
a lead-frame (for instance, 10), comprising a die pad (for instance, 14) having at least one electrically conductive die pad area (for instance, 17; 17a, 17b, 17c, 17d);
an insulating layer (for instance, 18; 18a, 18b, 18c, 18d) which may be applied onto said at least one electrically conductive die pad area;
an electrically conductive layer (for instance, 20; 20a, 20b, 20c, 20d) which may be applied onto said insulating layer;
at least one semiconductor die (for instance, 22) which may be coupled to said electrically conductive layer, wherein the at least one electrically conductive die pad area, the electrically conductive layer and the insulating layer sandwiched therebetween may form at least one capacitor integrated in the device, and wherein:
the at least one electrically conductive die pad area may comprise a sculptured structure with valleys (for instance, U) and peaks (for instance, P) therein; and
the electrically conductive layer may comprise electrically conductive material extending into the valleys in said sculptured structure of the at least one electrically conductive die pad area.

In one or more embodiments, the electrically conductive layer may comprise adhesive material, wherein the at least one semiconductor die (22) may be adhesively coupled to said electrically conductive layer.

In one or more embodiments, the sculptured structure of the at least one electrically conductive die pad area may comprise at least one periodic pattern of valleys and peaks.

In one or more embodiments, the sculptured structure of the at least one electrically conductive die pad area may comprise a comb-like (for instance, 16) cross-sectional profile.

In one or more embodiments, the die pad may comprise a plurality of electrically conductive die pad areas (for instance, 17a, 17b, 17c, 17d) which may provide a plurality of capacitors integrated in the device.

In one or more embodiments, the die pad may comprise a plurality of electrically conductive die pad areas comprising respective sculptured portions with valleys and peaks therein.

In one or more embodiments, said respective sculptured portions of the plurality of electrically conductive die pad areas in the die pad may comprise respective sculptured portions differing from one another for at least one of:

the surface areas of the sculptured portions; and/or the orientation of the valleys and peaks therein; and/or the sizes and/or shapes (for instance, a, b, c, d, e) of the valleys and peaks therein.

In one or more embodiments, the electrically conductive layer may comprise a plurality of electrically conductive portions (for instance, 20a, 20b, 20c, 20d) which may provide a plurality of capacitors integrated in the device.

In one or more embodiments, the semiconductor device may comprise a package (for instance, 28) which may be molded onto the at least one semiconductor die coupled to said electrically conductive layer.

In One or More Embodiments:

the lead-frame may comprise an array of electrical contact formations (for instance, 12; 12a, 12b, 12c, 12d) around the die pad;

the electrically conductive layer may comprise at least one extension (for instance, 21; 21a, 21b, 21c, 21d) coupled to at least one electrical contact formation in said array of electrical contact formation to provide electrical coupling therewith.

In one or more embodiments:

the lead-frame may comprise an array of electrical contact leads (for instance, 12) around the die pad;

wire bonding (for instance, 24a, 24b) may be provided, electrically coupling (for instance, 240) said electrically conductive layer with at least one lead (for instance, 12a) in said array of electrical contact leads (12) around the die pad and/or said at least one semiconductor die at a contact location (for instance, 22a) opposite said electrically conductive layer.

One or more embodiments may comprise a method (for instance, 140) of manufacturing a semiconductor device according to one or more embodiments.

In one or more embodiments, the method may comprise:

providing (for instance, 141) said sculptured structure by selectively etching, preferably by laser etching, the lead-frame at said at least one electrically conductive die pad area in the die pad; and/or forming (for instance, 142) said insulating layer by one of jet printing, spraying or aerosol deposition of insulating curable material, and heat curing and/or UV curing said insulating layer which may be applied onto said at least one electrically conductive die pad area; and/or forming (for instance, 144) said electrically conductive layer onto at least one portion of said insulating layer by screen printing electrically conductive filling material; and/or including electrically conductive adhesive material in said electrically conductive layer and adhesively coupling said at least one semiconductor die to said electrically conductive layer.

The various embodiments described above may be combined to provide further embodiments.

Without prejudice to the underlying principles, the details and embodiments may vary, even significantly, with respect to what has been described by way of example only, without departing from the extent of protection.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method comprising:

etching, stamping, or ablating a die pad to form a plurality of peaks and valleys, wherein the die pad is made of an electrically conductive material;

forming an insulating layer on the die pad, the insulating layer covering the plurality of peaks and valleys of the die pad;

forming an electrically conductive layer on the insulating layer, wherein the die pad, the insulating layer, and the electrically conductive layer form a capacitor; and coupling a semiconductor die to the electrically conductive layer.

2. The method of claim 1, wherein etching, stamping, or ablating the die pad comprises laser etching the die pad.

3. The method of claim 1, wherein forming the insulating layer comprises forming the insulating layer by jet printing, spraying, or aerosol deposition.

4. The method of claim 3, wherein forming the insulating layer comprises curing the insulating layer.

5. The method of claim 1, wherein forming the electrically conductive layer comprises screen printing electrically conductive filling material on the insulating layer, wherein coupling the semiconductor die to the electrically conductive layer comprises placing the semiconductor doe on the electrically conductive adhesive prior to the electrically conductive filling material hardening.

6. The method of claim 1, wherein forming the electrically conductive layer comprises dispensing an electrically conductive adhesive material on the insulating layer, wherein coupling the semiconductor die to the electrically conductive layer comprises placing the semiconductor die on the electrically conductive adhesive material prior to the electrically conductive adhesive material hardening.

7. A method comprising:

forming, in a single layer of conductive material of a die pad, a plurality of peaks and a plurality of valleys at a first surface;

forming an insulating layer on the first surface of the die pad such that the insulating layer is on the plurality of peaks and the plurality of valleys without filling the plurality of valleys;

forming a conductive layer on the insulating layer and filling the plurality of valleys, wherein the die pad, the insulating layer, and the conductive layer form a capacitor; and coupling a semiconductor die to the conductive layer.

8. The method of claim 7, wherein coupling the semiconductor die to the conductive layer comprises directly coupling the semiconductor die to the conductive layer.

9. The method of claim 7, further comprising electrically coupling the semiconductor die to a plurality of leads.

10. The method of claim 9, further comprising coupling the die pad to one of the plurality of leads.

11. The method of claim 7, wherein forming the insulating layer comprises forming the insulating layer by jet printing, spraying, or aerosol deposition.

12. The method of claim 11, wherein forming the insulating layer includes curing the insulating layer.

13. A method comprising:
  etching a first surface of a die pad to form a plurality of peaks and a plurality of valleys in the first surface;
  forming a conformal insulating layer on the first surface of the die pad;
  forming an electrically conductive layer on the insulating layer, the electrically conductive layer extending into the plurality of valleys, wherein the die pad, the insulating layer, and the electrically conductive layer form a capacitor; and
  coupling a semiconductor die to the electrically conductive layer.

14. The method of claim 13, wherein a thickness of the conformal insulating layer is less than 1 micron.

15. The method of claim 13, wherein etching the first surface of the die pad comprises using a laser to etch the first surface of the die pad.

16. The method of claim 13, wherein forming the insulating layer comprises forming the insulating layer by jet printing, spraying, or aerosol deposition.

17. The method of claim 16, wherein forming the insulating layer includes curing the insulating layer.

18. The method of claim 13, wherein coupling the semiconductor die to the conductive layer comprises securing the semiconductor die directly to the conductive layer.

19. The method of claim 13, wherein the electrically conductive layer includes an adhesive material.

20. The method of claim 19, wherein the adhesive material of the electrically conductive layer couples the semiconductor die to the electrically conductive layer.

* * * * *

UNITED STATES PATENT AND TRADEMARK OFFICE
CERTIFICATE OF CORRECTION

PATENT NO. : 11,626,355 B2
APPLICATION NO. : 17/470269
DATED : April 11, 2023
INVENTOR(S) : Fulvio Vittorio Fontana et al.

It is certified that error appears in the above-identified patent and that said Letters Patent is hereby corrected as shown below:

In the Claims

Column 12, Claim 5, Line 40:
"semiconductor doe on the"
Should read:
-- semiconductor die on the --.

Signed and Sealed this
Sixth Day of June, 2023

Katherine Kelly Vidal
*Director of the United States Patent and Trademark Office*